(12) United States Patent
Blackburn

(10) Patent No.: US 6,917,316 B2
(45) Date of Patent: Jul. 12, 2005

(54) DIGITAL ADJUSTMENT OF GAIN AND OFFSET FOR DIGITAL TO ANALOG CONVERTERS

(75) Inventor: Jeffrey Blackburn, Austin, TX (US)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 10/440,669

(22) Filed: May 19, 2003

(65) Prior Publication Data

US 2004/0233087 A1 Nov. 25, 2004

(51) Int. Cl.[7] .......................... H03M 1/06; H03M 1/00; H03M 1/66
(52) U.S. Cl. ........................ 341/118; 341/135; 341/144
(58) Field of Search ................................ 341/144, 118, 341/120, 145, 135, 121, 154, 138; 363/73

(56) References Cited

U.S. PATENT DOCUMENTS

| | | | | |
|---|---|---|---|---|
| 4,272,760 A | * | 6/1981 | Prazak et al. ................ | 341/120 |
| 4,896,157 A | * | 1/1990 | Mijuskovic ................ | 341/144 |
| 5,459,653 A | * | 10/1995 | Seto et al. .................... | 363/73 |
| 5,748,128 A | * | 5/1998 | Bruccoleri et al. ......... | 341/144 |
| 6,518,906 B2 | * | 2/2003 | Abel et al. .................. | 341/144 |
| 6,545,622 B1 | * | 4/2003 | Kamal et al. ............... | 341/144 |
| 6,583,744 B2 | * | 6/2003 | Bright ......................... | 341/145 |
| 6,667,703 B1 | * | 12/2003 | Reuveni et al. ............. | 341/120 |

\* cited by examiner

*Primary Examiner*—Patrick Wamsley
(74) *Attorney, Agent, or Firm*—O'Melveny & Myers LLP (57) ABSTRACT

Improved digital to analog converter (DAC) circuitry incorporating the ability to utilize a single DAC to generate either voltage or current outputs, and the ability to digitally adjust the gain and offset. Previous digital to analog circuitry has been limited to a single type of analog output per DAC and to the use of external precision resistors to set the gain and offset for a single DAC, or a group of DACs. By utilizing the same on-chip circuitry to supply both types of outputs, chip area, power consumption and cost is reduced while offering more flexibility to the customer. The ability to digitally adjust the gain and offset for a group of DACs eliminates the cost of external resistors, lowers the board area, and lowers the assembly cost for the end product. In addition, since gain and offset can be adjusted dynamically, maximum flexibility is provided to the customer. Digital adjustment of gain and offset can be used to calibrate for chip and system errors, and can allow more exact adjustment and external precision resistors.

27 Claims, 7 Drawing Sheets

DIGITAL ADJUSTMENT OF GAIN AND OFFSET FOR DIGITAL TO ANALOG CONVERTERS

FIELD OF THE INVENTION

The invention relates to the field of integrated circuits and more particularly to the field of digital to analog converter circuitry.

BACKGROUND OF THE INVENTION

Circuits that convert a digital value, such as a sequence of binary digits, to an analog value, such as voltage or current, are known generally as digital to analog converters, or DACs. The output of a DAC can be an analog voltage or an analog current. In a typical DAC, a binary value is written into a register and circuitry converts this value into a voltage or current, which is available as an output from the DAC. It is often desirable that the analog output vary linearly with the digital input, and in this case, the conversion of the binary value into the voltage or current is a function of the gain and offset of the DAC. The voltage output of a linear DAC can be expressed as:

$$V_{out} = (V_{gain} \cdot (DATA/MAX)) + V_{offset}$$

and the current output of a linear DAC can be expressed as:

$$I_{out} = (I_{gain} \cdot (DATA/MAX)) + I_{offset}$$

where $V_{gain}$ is the voltage gain, $V_{offset}$ is the voltage offset, $I_{gain}$ is the current gain, $I_{offset}$ is the current offset, DATA is the digital input value and MAX is two raised to the number of bits in the digital input (e.g., 8192 in the case of a 13-bit digital input value). Voltage and current offsets and gains in general are not limited to positive values and can vary arbitrarily.

An existing method for setting the gain and offset of a DAC is to attach external precision resistors to the integrated circuit containing the DAC circuitry. The resistance of the resistors determines the gain and offset. In cases where multiple DACs are incorporated into a single integrated circuit, often the gain and offset for an entire group of DACs is set with a single pair of external resistors. A group of DACs can be of any size, and there can be any number of DACs implemented on a single device. The Edge6420, manufactured by Semtech Corporation, is an example of a device incorporating multiple groups of DACs. The Edge6420 has one group of 20 DACs, four groups of 8 DACs each, and one group of 12 DACs, for a total of 64 DACs. Typically DACs are configured either as voltage output DACs or current output DACs. In the case of the Edge6420, four of the groups consist of voltage output DACs and two of the groups consist of current output DACs.

The use of DACs dedicated to either voltage outputs or current outputs has several disadvantages. First, it decreases the flexibility of the device since the integrated circuit manufacturer fixes the number of current and voltage outputs. Alternatively, if user configuration of either current or voltage mode is desired, it increases the cost and power consumption of the device since two DACs would then be needed for a single output.

The use of external resistors to set the gain and offset for a group of DACs has several disadvantages. First, the customer must change the external resistors to change the gain or offset of a DAC group. This means that either a physical change to the device is needed, or the gain and offset must be fixed and cannot change dynamically. Also, since DACs may have a fairly large range of gains and offsets, a fairly large range of resistances is needed. Additionally, the precision of the gain and offset is limited by the precision of the resistors. Finally, the use of external resistors increases the cost of the end product (due to the cost of the resistors and the cost of additional board space), increases the cost of packaging due to additional pins, increases the cost of assembly, and increases the physical size of the end product.

SUMMARY OF THE INVENTION

The present invention is an improved apparatus for implementing DAC circuitry.

In some embodiments, a single DAC is used to provide either a voltage output or a current output depending on a mode signal.

In other embodiments, two levels of analog to digital converters are used, i.e., a first level of control DACs to digitally adjust the gain or offset and a second level of output DACs to generate the desired output. There may be two control DACs, i.e., one to set the gain of an output DAC and one to set the offset of an output DAC. The output DAC may provide a voltage output or a current output. There may be multiple output DACs forming a group, such that all of the gains and offsets of the output DACs in the group are set by the same control DACs. In the case of control signals from the control DACs that are voltages, they can be wired directly to multiple output DACs. In the case of control signals from the control DACs that are currents, they can be mirrored to create equivalent currents, each of which is wired to a single output DAC.

In some embodiments, a second digital input is provided to the control DACs and the two digital inputs are added together.

SUMMARY OF THE FIGURES

The present invention will be described with reference to the drawings, in which.

DETAILED DESCRIPTION

The present invention is directed to improved analog to digital conversion circuitry incorporating features that increase the flexibility and lower the cost. In particular, the ability to digitally adjust gain and offset is provided, and circuitry to allow a single converter to provide either a voltage output or a current output is provided.

Figure 1:
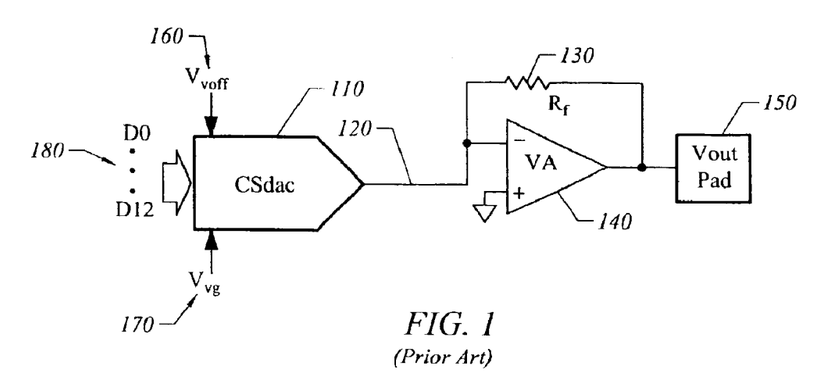
FIG. 1 illustrates a prior art digital to analog converter with a voltage output.

FIG. 1 illustrates a prior art voltage output digital to analog converter (DAC) circuitry. CSdac 110 is a current steering digital to analog converter (CSdac) that accepts digital input 180, voltage gain 170, voltage offset 160 and produces a current output on line 120, proportional to the binary value present on digital input 180. Current output 120 is coupled to the negative input of voltage amplifier 140 and to one side of feedback resistor 130. The positive input of voltage amplifier 140 is coupled to ground and the other side of feedback resistor 130 is coupled to the output of voltage amplifier 140. The output of voltage amplifier 140 is also coupled to the voltage output pad 150.

The DAC circuitry in FIG. 1 converts the 13-bit binary input value present on digital input 180 into an analog output voltage on pin 150, linearly proportional to the digital input. The current steering DAC 110 is used to convert the digital input into a current, and voltage amplifier 140 is used to convert the current into a voltage. The feedback resistor 130 is ratiometrically matched to resistors internal to CSdac 110. Ratiometric matching is a method of laying out on-chip resistors such that the ratio of the resistances is tightly controlled and precisely known, even if the absolute value of resistance is not. By using ratiometric matching, it is possible to develop circuitry with very accurate outputs even when the resistances themselves are not known very accurately. The voltage gain 170 and voltage offset 160 inputs to CSdac 110 are generated by the circuitry illustrated in FIG. 3, discussed below.

Figure 2:
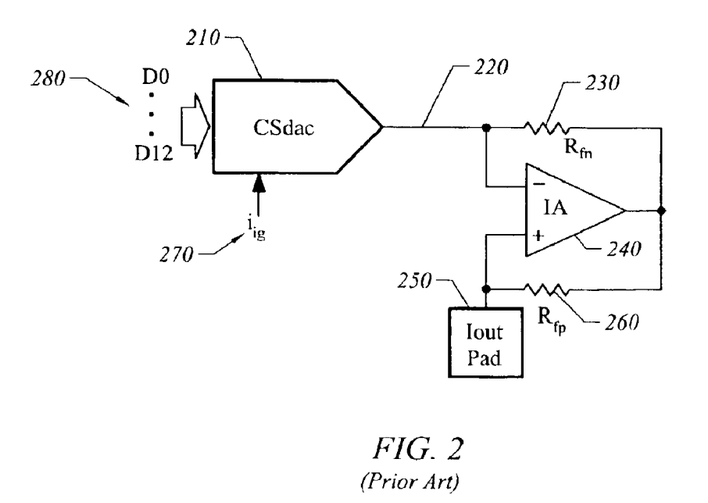
FIG. 2 illustrates a prior art digital to analog converter with a current output.

FIG. 2 illustrates a prior art current output DAC circuitry. CSdac 210 accepts digital input 280, current gain 270 and produces a current output on line 220, proportional to the binary value present on digital input 280. Current output 220 is coupled to the negative input of current amplifier 240 and to one side of feedback resistor 230. The other side of feedback resistor 230 is coupled to the output of current amplifier 240 and to another feedback resistor 260. The positive input of current amplifier 240 is coupled to output pad 250 and to the other side of feedback resistor 260.

The DAC circuitry in FIG. 2 converts the 13-bit binary input value present on digital input 280 into an analog output current on pin 250, linearly proportional to the digital input. The current steering DAC 210 is used to convert the digital input into a current, and current amplifier 240 is used to amplify that current into a current to be supplied external to the device. The feedback resistors 230 and 260 are ratiometrically matched to each other as described above. The ratio of feedback resistor 230 to feedback resistor 260 determines the current gain from CSdac output 220 to the current supplied to output pad 250. The current gain 270 input to CSdac 210 is generated by the circuitry illustrated in FIG. 4, discussed below.

Figure 3:
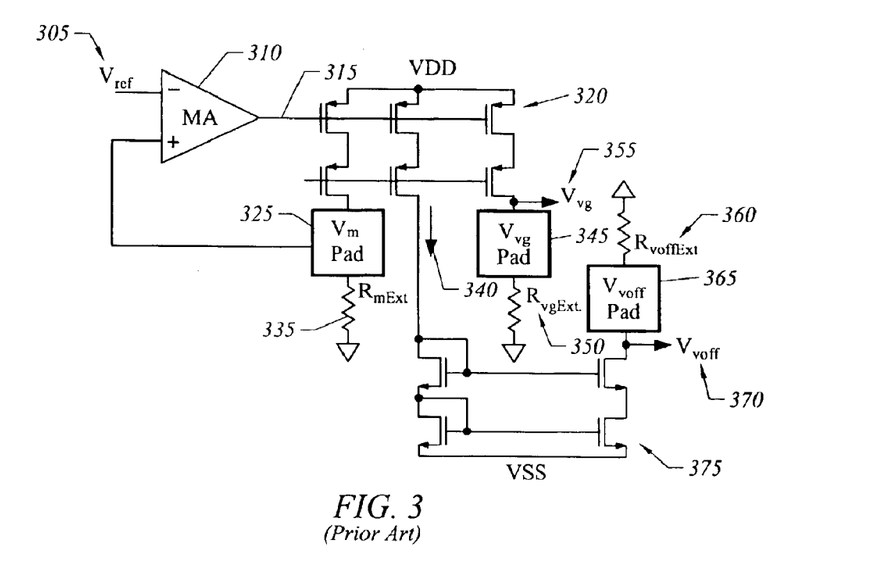
FIG. 3 illustrates prior art circuitry utilizing external resistors to set gain and offset for a voltage output digital to analog converter.

FIG. 3 illustrates prior art circuitry in which external resistors are used to set the gain and offset for a group of voltage output DACs. Externally supplied reference voltage $V_{ref}$ 305 is coupled to the negative input of master amplifier 310. Master amplifier 310 output 315 is coupled to six-transistor current mirror 320, which creates three matching currents. A current mirror utilizes the ability to create on-chip transistors that have matching characteristics, and thus identical source currents for a given gate voltage. One end of current mirror 320 is coupled to source voltage supply VDD and the three current outputs are coupled to master resistor pad 325, voltage gain resistor pad 345 and to conductor 340 respectively. Master resistor pad 325 is also coupled to the positive input of master amplifier 310 and to one side of external resistor 335. The other side of external resistor 335 is coupled to ground. Voltage gain resistor pad 345 is also coupled to voltage gain output 355 and to one side of external resistor 350. The other side of external resistor 350 is coupled to ground. Conductor 340 is coupled to four-transistor current mirror 375, which creates two matching currents. One end of current mirror 375 is coupled to source voltage supply VSS and the two current outputs are coupled to conductor 340 and to voltage offset resistor pad 365, respectively. Voltage offset resistor pad 365 is also coupled to voltage offset output 370 and to one side of external resistor 360. The other side of external resistor 360 is coupled to ground.

The circuitry of FIG. 3 is used to generate two voltages, i.e., voltage gain output 355 and voltage offset output 370. The value of external reference voltage 305 and external master resistor 335 control the current flowing through external resistor 335, and in turn control the current that is mirrored by current mirror 320. The same current flowing through external resistors 350 and 360 will create known voltage drops and thereby set the value of voltage gain output 355 and voltage offset voltage 360. Since the voltage offset may be set to a negative value, the current must be mirrored through a second current mirror 375 and referenced to a negative voltage. Thus the gain and offset are determined by the ratios of the external precision resistors 335, 350 and 360. Typically these resistors are 0.1% precision resistors, but other values of precision may be used. In order to adjust the output of the circuitry shown in FIG. 3, the external resistors must be manually modified.

The gain and offset outputs 355 and 370 are coupled to a voltage output DAC, such as that shown in FIG. 1. In the case that a group of voltage output DACs are all being supported by the circuitry of FIG. 3, voltage gain output 355 and voltage offset output 370 would be coupled to all DACs in the group. In the case that multiple groups of voltage output DACs are present, only a portion of the circuitry shown in FIG. 3 need be replicated. Particularly, there need only be a single master amplifier 310, master resistor pad 325 and external master resistor 335. Current mirrors 320 and 375 would be expanded to incorporate additional current outputs such that one pair of external resistors 350 and 360, and one pair of outputs 335 and 370 are present for each group of DACs to be supported.

Figure 4:
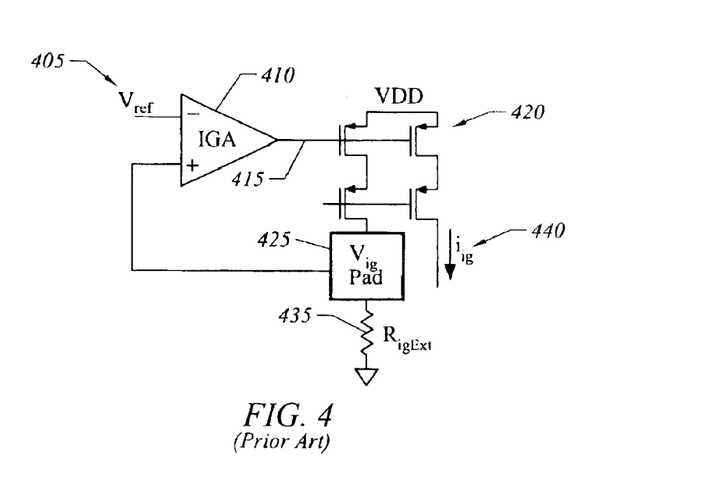
FIG. 4 illustrates prior art circuitry utilizing an external resistor to set gain for a current output digital to analog converter.

FIG. 4 illustrates prior art circuitry in which an external resistor is used to set the gain for a group of current output DACs. Externally supplied reference voltage $V_{ref}$ 405 is coupled to the negative input of current gain amplifier 410. Current gain amplifier 410 output 415 is coupled to four-transistor current mirror 420, which creates two matching currents. One end of current mirror 420 is coupled to source voltage supply VDD and the two current outputs are coupled to current gain resistor pad 425 and current gain output 440, respectively. Current gain resistor pad 425 is also coupled to the positive input of current gain amplifier 410 and to one side of external resistor 435. The other side of external resistor 435 is coupled to ground.

The circuitry of FIG. 4 is used to generate a current gain output current 440. The value of external reference voltage 405 and external current gain resistor 435 control the current flowing through external resistor 435, and in turn control the current that is mirrored by current mirror 420 and supplied to current gain output 440. Thus, external precision resistor 435 determines the gain. In order to adjust the output of the circuitry shown in FIG. 4, the external resistor must be manually modified.

The gain output 440 is coupled to a current output DAC, such as that shown in FIG. 2. In the case that a group of current output DACs is supported by the circuitry of FIG. 4, a individual current gain output would be needed for each DAC in the group. Current mirror 420 would be expanded to incorporate additional current outputs, i.e., one for each DAC. In the case that multiple groups of current output DACs are present, all of the circuitry shown in FIG. 4 would be replicated for each group.

Figure 5:
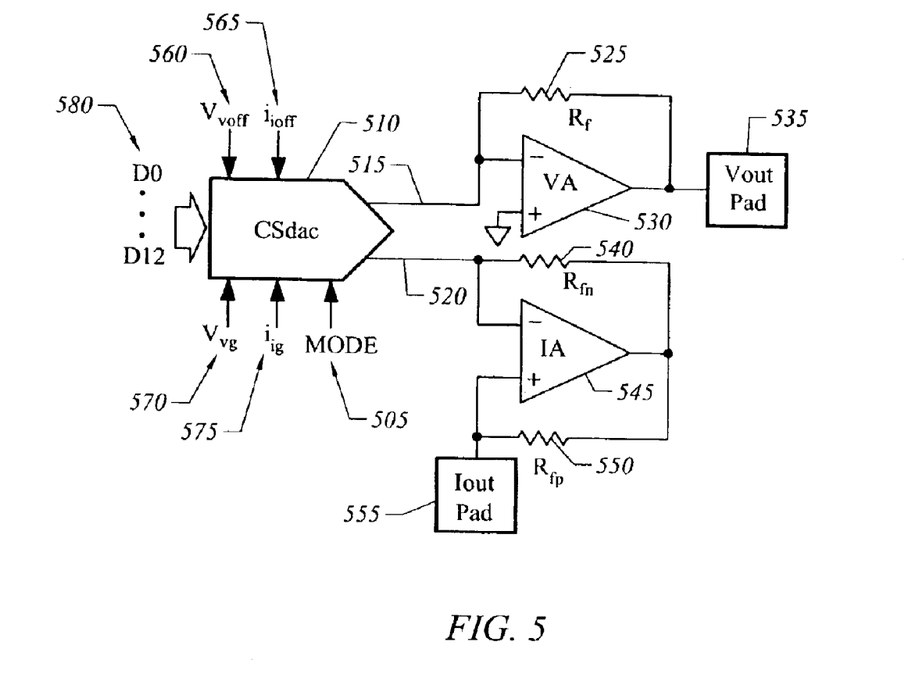
FIG. 5 illustrates an embodiment of a single DAC to provide both a voltage output and a current output.

FIG. 5 illustrates an embodiment of the present invention in which a single CSdac is used to generate both voltage and current outputs. CSdac 510 accepts digital input 580, voltage gain input 570, voltage offset input 560, current gain input 575, current offset input 565, and mode input 505, and generates outputs 515 and 520 proportional to the binary value present on digital input 580. Output 515 is coupled to the negative input of voltage amplifier 530 and to one side of feedback resistor 525. The positive input of voltage amplifier 530 is coupled to ground and the other side of feedback resistor 525 is coupled to the output of voltage amplifier 530. The output of voltage amplifier 530 is also coupled to voltage output pad 535. Output 520 is coupled to the negative input of current amplifier 545 and to one side of feedback resistor 540. The other side of feedback resistor 540 is coupled to the output of current amplifier 545 and to another feedback resistor 550. The positive input of current amplifier 545 is coupled to output pad 555 and to the other side of feedback resistor 550.

The circuitry of FIG. 5 can operate in either a voltage mode or a current mode, as controlled by mode input 505. Mode input 505 may originate from an external pin, by a bit stored in an internal register, or by some other mechanism that generates a control signal. If the voltage mode is selected, the voltage gain input 570 and voltage offset input 560 are converted inside CSdac 510 into a current output 515. Output 515 is then converted by voltage amplifier 530 to a voltage that is provided on voltage output pad 535. If the current mode is selected, the current gain input 575 and the current offset input 565 are converted inside CSdac 510 into a current output 520. Output 520 is then amplified by current amplifier 545 to provide a current on current output pad 555. The four gain and offset inputs 570, 560, 575 and 565 to CSdac 510 are generated by the circuitry illustrated in FIGS. 6 and 7.

Figure 6:
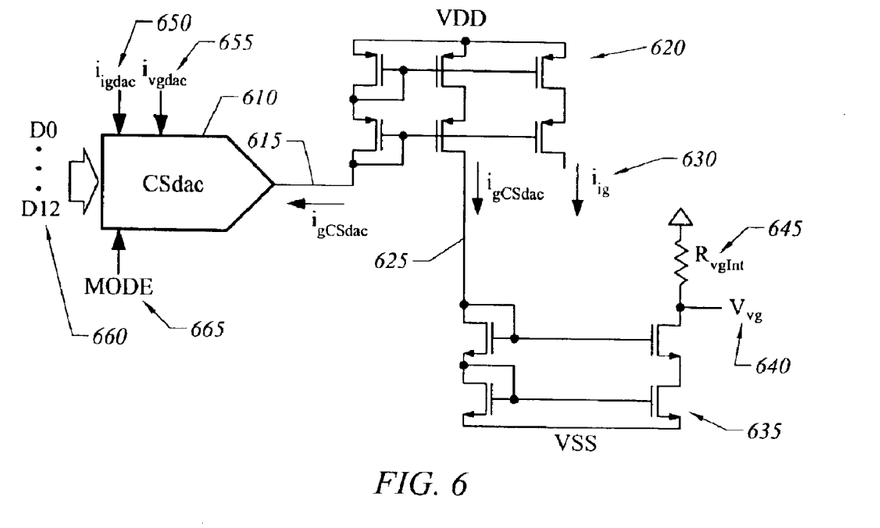
FIG. 6 illustrates an embodiment of circuitry that digitally sets the voltage gain and current gain for a digital to analog converter.

FIG. 6 illustrates an embodiment of circuitry that generates the voltage gain and current gain inputs to the circuitry of FIG. 5. The group gain is set using a digital input value rather than through the use of external resistors as in the prior art. Digital input 660 is used by CSdac 610 to produce a current output 615 that is linearly proportional to the input value. Current gain input 650 and voltage gain input 655 are used to set the gain of CSdac 610, depending on mode input 665. CSdac output 615 is coupled to six-transistor current mirror 620, which creates three matching currents. One end of current mirror 620 is coupled to source voltage supply VDD and the three current outputs are coupled to CSdac output 615, current gain output 630 and conductor 625, respectively. Conductor 625 is coupled to four-transistor current mirror 635, which creates two matching currents. One end of current mirror 635 is coupled to source voltage supply VSS and the two current outputs are coupled to conductor 625 and to voltage gain output 640, respectively.

Voltage gain output 640 is also coupled to one side of internal resistor 645. The other side of internal resistor 645 is coupled to ground.

The circuitry of FIG. 6 is used to generate voltage gain output voltage 640 and current gain output current 630. The current input from voltage gain input 655, the value of digital input value 660 and the value of internal resistor 645 control the voltage output on voltage gain output 640. The current input from current gain input 650 and the value of digital input value 660 control the current output on current gain output 630. The gain inputs 655 and 650 are generated by the circuitry illustrated in FIGS. 8 and 9, discussed below.

The voltage and current gain outputs 640 and 630 are coupled to a voltage and current output DAC, such as that shown in FIG. 5. In the case that a group of voltage and current output DACs are all being supported by the circuitry of FIG. 6, voltage gain output 640 would be coupled to all DACs in the group. Additionally, an individual current gain output would be needed for each DAC in the group. Current mirror 620 would be expanded to incorporate additional current outputs, i.e., one for each DAC. In the case that multiple groups of voltage and current output DACs are present, all of the circuitry shown in FIG. 6 would be replicated for each group. Digital input 660 is illustrated as a 13-bit digital input, but if lower resolution is required for gain adjustment, a smaller size input could be used, thereby reducing power and chip area.

Figure 7:
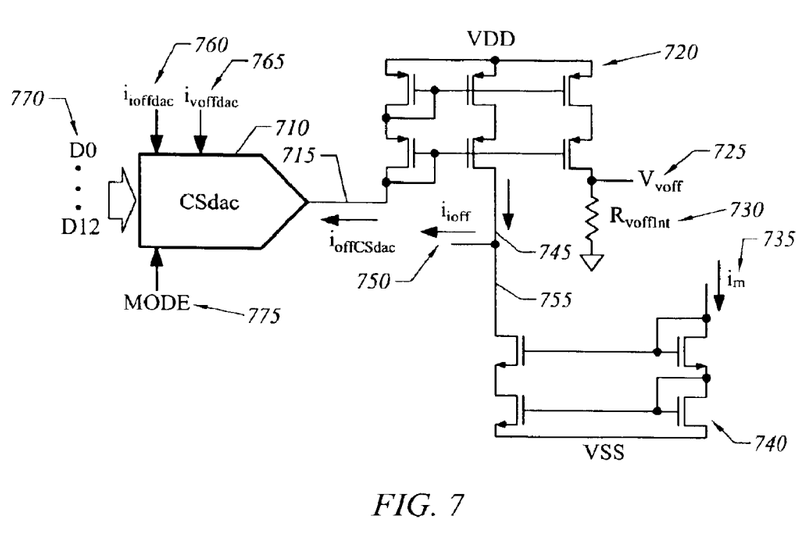
FIG. 7 illustrates an embodiment of circuitry that digitally sets the voltage offset and current offset for a digital to analog converter.

FIG. 7 illustrates an embodiment of circuitry that generates the voltage offset and current offset inputs to the circuitry of FIG. 5. The offset is set using a digital input value rather than through the use of external resistors as in the prior art. Digital input 770 is used by CSdac 710 to produce a current output 715 that is linearly proportional to the input value. Current offset input 760 and voltage offset input 765 are used to set the gain of CSdac 710, depending on mode input 775. CSdac output 715 is coupled to six-transistor current mirror 720, which creates three matching currents. One end of current mirror 720 is coupled to source voltage supply VDD and the three current outputs are coupled to CSdac output 715, voltage offset output 725, and conductor 745, respectively. Voltage offset output 725 is also coupled to one end of internal resistor 730. The other end of internal resistor 730 is coupled to ground. Conductor 745 is coupled to current offset output 750 and to conductor 755. Conductor 755 is coupled to four-transistor current mirror 740, which creates two matching currents. One end of current mirror 740 is coupled to source voltage supply VSS and the two current outputs are coupled to conductor 755 and to master current input 735.

The circuitry of FIG. 7 is used to generate voltage offset output voltage 725 and current gain output current 750. The current input from voltage offset input 765, the value of digital input value 770 and the value of internal resistor 730 control the voltage output on voltage offset output 725. The current input from current offset input 760, the value of digital input value 770, and the current input from master current input 735 control the current output on current offset output 750. The offset inputs 765 and 760 and the master current input 735 are generated by the circuitry illustrated in FIGS. 8 and 9, discussed below.

The voltage and current offset outputs 725 and 750 are coupled to a voltage and current output DAC, such as that shown in FIG. 5. In the case that a group of voltage and current output DACs are all being supported by the circuitry of FIG. 7, voltage offset output 725 would be coupled to all DACs in the group. Additionally, an individual current offset output would be needed for each DAC in the group. Current mirrors 720 and 740 would both be expanded to incorporate additional current outputs, i.e., one for each DAC. In the case that multiple groups of voltage and current output DACs are present, all of the circuitry shown in FIG. 7 would be replicated for each group. Digital input 770 is illustrated as a 13-bit digital input, but if lower resolution is required for offset adjustment, a smaller size input could be used, thereby reducing power and chip area.

Figure 8:
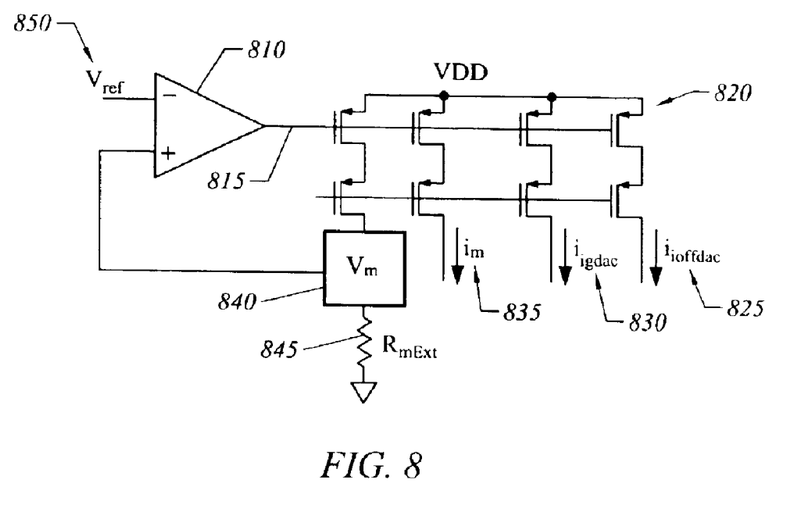
FIG. 8 illustrates an embodiment of support circuitry to provide inputs for current gain and offset to the circuitry of FIGS. 6 and 7.

FIG. 8 illustrates an embodiment of circuitry that generates the current gain and current offset inputs to the circuitry of FIGS. 6 and 7. An external resistor is used to create a master current adjusted to the voltage reference input. Externally supplied reference voltage 850 is coupled to the negative input of amplifier 810. Amplifier 810 output 815 is coupled to eight-transistor current mirror 820, which creates four matching currents. One end of current mirror 820 is coupled to source voltage supply VDD and the four current outputs are coupled to master resistor pad 840, master current output 835, current gain output 830 and current offset output 825, respectively. Master resistor pad 840 is also coupled to the positive input of amplifier 810 and to one side of external resistor 845. The other side of external resistor 845 is coupled to ground.

The circuitry of FIG. 8 is used to generate three currents to be used by the circuitry in FIGS. 6 and 7, which is in turn used to control the gain and offset of a group of current output DACs. The external resistor 845, preferably a 0.1% precision resistor, and the external voltage 850 are used to set the ideal current reference for the chip. Mirrored versions of this current are output by the circuitry in FIG. 8. In the case that multiple groups of current output DACs are all being supported by the circuitry of FIG. 8, separate current outputs would be needed for each group. Current mirror 820 would be expanded to provide three current outputs for each group of DACs.

Since the current gain output current 830 is created with externally set parameters (i.e. external reference voltage 850 and external master resistor 845), the error from the digital input 660 of FIG. 6 to the current gain output 630 is minimized. Similarly, since current offset current 825 is created the same way, the error from the digital input 770 of FIG. 7 to the current offset output 750 is minimized. Master current output 835 is an accurate negative offset provided to the master current input 735 of FIG. 7. Master current input 735 is mirrored onto conductor 755 and is then summed with the current provided on conductor 745, which is a current linearly varying with the digital input code 770. The summed current, current offset output 750, is provided to the current output DACs. The use of a negative master current input 735 allows the current offset output 750 to be adjusted both positive and negative to eliminate circuit offset errors.

Figure 9:
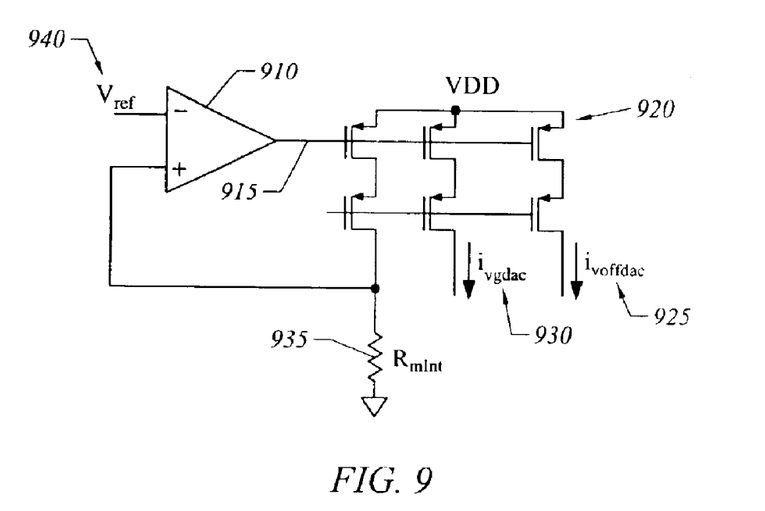
FIG. 9 illustrates an embodiment of support circuitry to provide inputs for voltage gain and offset to the circuitry of FIGS. 6 and 7.

FIG. 9 illustrates an embodiment of circuitry that generates the voltage gain and voltage offset inputs to the circuitry of FIGS. 6 and 7. An internal resistor is used to create reference currents. Externally supplied reference voltage 940 is coupled to the negative input of amplifier 910. Amplifier 910 output 915 is coupled to six-transistor current mirror 920, which creates three matching currents. One end of current mirror 920 is coupled to source voltage supply VDD and the three current outputs are coupled to the positive input of amplifier 910, voltage gain output 930, and voltage offset output 925, respectively. The positive input of amplifier 910 is also coupled to one end of internal resistor 935. The other end of internal resistor 935 is coupled to ground.

The circuitry of FIG. 9 is used to generate two currents to be used by the circuitry in FIGS. 6 and 7, which is in turn used to control the gain and offset of a group of voltage output DACs. Internal resistor 935 is ratiometrically matched to internal resistor 645 in FIG. 6 and internal resistor 730 in FIG. 7. In the case that multiple groups of voltage output DACs are all being supported by the circuitry of FIG. 9, separate current outputs would be needed for each group. Current mirror 920 would be expanded to provide two current outputs for each group of DACs.

Since the voltage gain output current 930 is created with an externally set parameter (i.e., external reference voltage 940) and since internal resistor 935 is ratiometrically matched to internal resistor 645 on FIG. 6, the error from the digital input value 660 on FIG. 6 to the voltage gain output voltage 640 is minimized. Similarly, since voltage offset current 925 is created in the same way, and since internal resistor 935 is also ratiometrically matched to internal resistor 730 on FIG. 7, the error from digital input value 770 on FIG. 7 to voltage offset output 725 is minimized.

Figure 10:
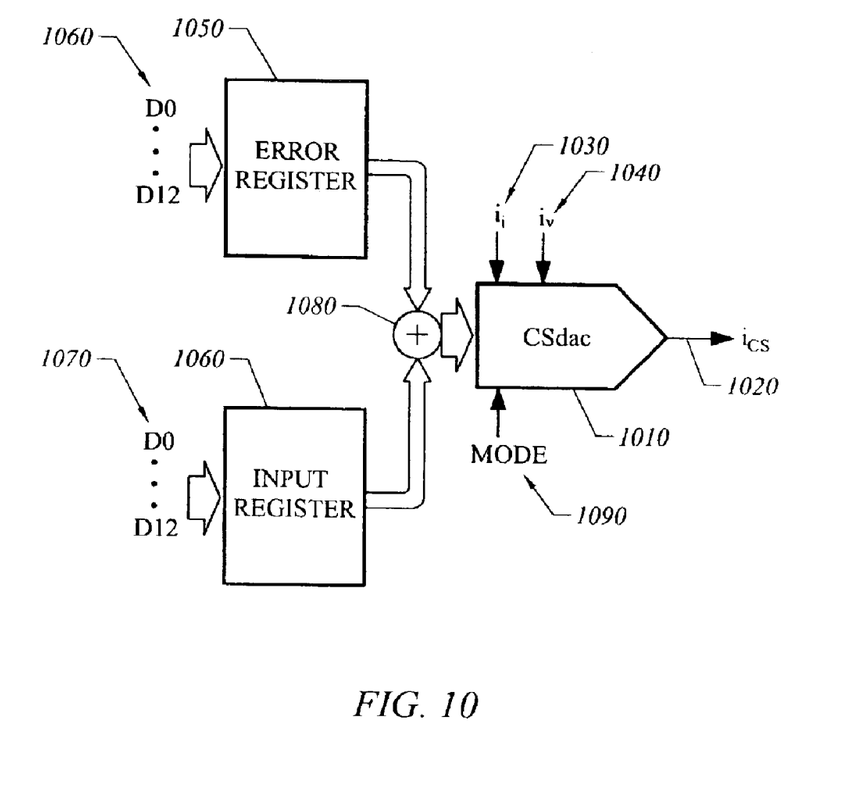
FIG. 10 illustrates an embodiment of circuitry to digitally adjust the inputs to a digital to analog converter.

FIG. 10 illustrates an alternative embodiment of the circuitry shown in FIGS. 6 and 7 in which two digital inputs are used to drive the gain adjustment DAC and/or the offset adjustment DAC. Error register 1050 accepts digital input 1060 and provides its output to adder 1080. Input register 1060 accepts digital input 1070 and also provides its output to adder 1080. Adder 1080 adds both of its digital inputs and provides the summed input to CSdac 1010. The output of adder 1080 acts in a similar manner to digital input 660 on FIG. 6 and digital input 770 in FIG. 7. Current input 1030, voltage input 1040 and mode input 1090 are analogous to the three inputs 650, 655 and 665 in FIGS. 6 and 760, 765 and 775 in FIG. 7. CSdac output 1020 is coupled to the remaining circuitry of FIG. 6 or FIG. 7.

The use of two registers to drive the group gain or group offset CSdac can be used to make fine adjustments to calibrate for circuit error. Circuit error consists of a chip component as well as a system component and error register 1050 can be configured to calibrate for either or both. By configuring error register 1050 with a circuit error adjustment, the ideal digital input code, loaded into register 1070, will create an ideal analog gain or offset adjustment. Error register 1050 can be a dynamically loadable register, a combination of static storage elements, or a combination of the two. In some embodiments, error register 1050 would be factory calibrated during test by blowing fuses or configuring electrically alterable memory cells. In some embodiments the error register could be invisible to the customer and not loadable by the customer. In other embodiments, a factory calibration would be a default power-up value and the customer could override it by loading a new digital code into error register 1050 after power-up. There could also be an additional input to adder 1080 to accommodate both factory and system error adjustments. Providing both types of error adjustments allows maximum flexibility for the customer to calibrate the error out of their system and load the ideal digital input code into register 1070.

In alternative embodiments, if both voltage and current mode need not be supported, the circuitry shown in FIG. 5 could be used with only one of the two sets of inputs and with no mode input. Additionally, the support circuitry of FIGS. 6 and 7 would need support only one of the two types of outputs, and only one of the circuitry of FIGS. 8 and 9 need be provided.

In some embodiments it may be desirable to have voltage output DACs and current output DACs simultaneously enabled in the same group. In this case, different CSdacs would be used to generate the voltage gain and offset and the current gain and offset. In some embodiments, for a given group of DACs, it may be necessary to support adjustment of only gain and not offset, or only offset and not gain. In this case, the circuitry of FIGS. 5–9 could be simplified to provide only the outputs necessary.

One skilled in the art will appreciate that the present invention can be practiced by other than the described embodiments, which are presented for purpose of illustration and not of limitation.

What is claimed is:

1. An integrated circuit for adjusting the gain of a digital-to-analog converter comprising:
   a secondary digital-to-analog converter receiving a digital input value and producing an analog signal having current corresponding to said digital input value;
   a first current mirror circuit coupled to said secondary digital-to-analog converter and producing matching first and second current outputs corresponding to said analog signal, said first current output providing a current gain adjustment signal for said digital-to-analog converter;
   a second current mirror circuit coupled to said first current mirror circuit and producing a current output matching said second current output of said first current mirror circuit; and
   a resistor coupled to said current output of said second current mirror circuit and providing a voltage gain adjustment signal for said digital-to-analog converter;
   wherein, said current gain adjustment signal and said voltage gain adjustment signal are determined by said integrated circuit without external resistors.

2. The integrated circuit of claim 1, wherein said secondary digital-to-analog converter further receives at least one of a current gain input signal and a voltage gain input signal.

3. The integrated circuit of claim 2, wherein said secondary digital-to-analog converter further receives a mode input for selecting between said current gain input signal and said voltage gain input signal.

4. The integrated circuit of claim 2, further comprising an amplifier circuit providing said current gain input signal and said voltage gain input signal.

5. The integrated circuit of claim 1, wherein said resistor is internal to said integrated circuit.

6. The integrated circuit of claim 1, wherein said digital input value comprises a thirteen-bit digital value.

7. The integrated circuit of claim 1, wherein said secondary digital-to-analog converter comprises a current steering digital-to-analog converter.

8. An integrated circuit for adjusting the offset of a digital-to-analog converter comprising:
   a secondary digital-to-analog converter receiving a digital input value and producing an analog signal having current corresponding to said digital input value;
   a first current mirror circuit coupled to said secondary digital-to-analog converter and producing matching first and second current outputs corresponding to said analog signal, said first current output providing a current offset adjustment signal for said digital-to-analog converter;
   a resistor coupled to said second current output of said current mirror circuit and providing a voltage offset adjustment signal for said digital-to-analog converter; and
   a second current mirror circuit coupled to said first current mirror circuit and receiving a master current input; and
   wherein, said current offset adjustment signal and said voltage offset adjustment signal are determined by said integrated circuit without external resistors.

9. The integrated circuit of claim 8, wherein said secondary digital-to-analog converter further receives at least one of a current offset input signal and a voltage offset input signal.

10. The integrated circuit of claim 9, wherein said secondary digital-to-analog converter further receives a mode input for selecting between said current offset input signal and said voltage offset input signal.

11. The integrated circuit of claim 9, further comprising an amplifier circuit providing said current offset input signal and said voltage offset input signal.

12. The integrated circuit of claim 8, wherein said resistor is internal to said integrated circuit.

13. The integrated circuit of claim 8, wherein said digital input value comprises a thirteen-bit digital value.

14. The integrated circuit of claim 8, wherein said secondary digital-to-analog converter comprises a current steering digital-to-analog converter.

15. An integrated circuit for adjusting the gain and offset of a digital-to-analog converter comprising:
   a gain control circuit including a secondary digital-to-analog converter receiving a digital input value and producing an analog signal having current corresponding to said digital input value, a first current mirror circuit coupled to said secondary digital-to-analog converter and producing matching first and second current outputs corresponding to said analog signal, said first current output providing a current gain adjustment signal for said digital-to-analog converter, a second current mirror circuit coupled to said first current mirror circuit and producing a current output matching said second current output of said first current mirror circuit, and a resistor coupled to said current output of said second current mirror circuit and providing a voltage gain adjustment signal for said digital-to-analog converter;
   an offset control circuit including a secondary digital-to-analog converter receiving a digital input value and producing an analog signal having current corresponding to said digital input value, a current mirror circuit coupled to said secondary digital-to-analog converter and producing matching first and second current outputs corresponding to said analog signal, said first current output providing a current offset adjustment signal for said digital-to-analog converter, a resistor coupled to said second current output of said current mirror circuit and providing a voltage offset adjustment signal for said digital-to-analog converter, and a second current mirror circuit coupled to said first current mirror circuit and receiving a master current input;
   wherein, said current gain adjustment signal, said voltage gain adjustment signal, said current offset adjustment signal, and said voltage offset adjustment signal are determined by said integrated circuit without external resistors.

16. The integrated circuit of claim 15, wherein said secondary digital-to-analog converter of said gain control circuit further receives at least one of a current gain input signal and a voltage gain input signal.

17. The integrated circuit of claim 16, wherein said secondary digital-to-analog converter of said gain control circuit further receives a mode input for selecting between said current gain input signal and said voltage gain input signal.

18. The integrated circuit of claim 16, wherein said gain control circuit further comprising an amplifier circuit providing said current gain input signal and said voltage gain input signal.

19. The integrated circuit of claim 15, wherein said secondary digital-to-analog converter of said offset control circuit further receives at least one of a current offset input signal and a voltage offset input signal.

20. The integrated circuit of claim 19, wherein said secondary digital-to-analog converter of said offset control circuit further receives a mode input for selecting between said current offset input signal and said voltage offset input signal.

21. The integrated circuit of claim 19, wherein said offset control circuit further comprising an amplifier circuit providing said current offset input signal and said voltage offset input signal.

22. The integrated circuit of claim 15, wherein said resistor of said gain control circuit and said resistor of said offset control circuit are internal to said integrated circuit.

23. The integrated circuit of claim 15, wherein said digital input value to said gain control circuit comprises a thirteen-bit digital value.

24. The integrated circuit of claim 15, wherein said secondary digital-to-analog converter of said gain control circuit comprises a current steering digital-to-analog converter.

25. The integrated circuit of claim 15, wherein said resistor of said offset control circuit is internal to said integrated circuit.

26. The integrated circuit of claim 15, wherein said digital input value to said offset control circuit comprises a thirteen-bit digital value.

27. The integrated circuit of claim 15, wherein said secondary digital-to-analog converter of said offset control circuit comprises a current steering digital-to-analog converter.

* * * * *